US012725641B2

(12) United States Patent
Yang

(10) Patent No.: US 12,725,641 B2
(45) Date of Patent: Sep. 1, 2026

(54) MEMORY SYSTEM AND MEMORY DIE WITH CASCADED CALCULATING CIRCUITS

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 193 days.

(21) Appl. No.: 18/426,356

(22) Filed: Jan. 30, 2024

(65) Prior Publication Data

US 2025/0246217 A1 Jul. 31, 2025

(51) Int. Cl.

*G11C 7/10* (2006.01)
*G06F 7/501* (2006.01)
*G11C 7/14* (2006.01)

(52) U.S. Cl.

CPC ............ *G11C 7/1063* (2013.01); *G06F 7/501* (2013.01); *G11C 7/14* (2013.01)

(58) Field of Classification Search

CPC .......... G11C 7/1063; G11C 7/14; G06F 7/501
See application file for complete search history.

(56) References Cited

U.S. PATENT DOCUMENTS

2016/0078906 A1* 3/2016 Yamaguchi .............. G11C 8/12 365/51
2019/0332355 A1* 10/2019 Tinker ................ G06F 7/49947
2025/0252983 A1* 8/2025 Yang ...................... H03K 19/20

FOREIGN PATENT DOCUMENTS

WO WO-2022203059 A1 * 9/2022 ............. H04L 25/03

OTHER PUBLICATIONS

Amplification Circuit (Year: 2022).*
"Office Action of Taiwan Counterpart Application", issued on Nov. 22, 2024, p. 1-p. 5.

* cited by examiner

*Primary Examiner* — Sultana Begum
(74) *Attorney, Agent, or Firm* — JCIPRNET

(57) ABSTRACT

Memory systems and memory dies are provided. The memory system of the present disclosure includes a plurality of memory dies stacked within the memory system. Each memory die includes a numbering circuit configured to generate an output number signal according to an input number signal. The numbering circuit includes a plurality of calculating circuits coupled in series, each of the calculating circuits being configured to generate a first output bit and a second output bit. A current stage calculating circuit is configured to receive the first output bit from a previous stage calculating circuit and a corresponding bit of the input number signal to generate the first output bit and the second output bit, and the second output bit being output as a corresponding bit of the output number signal.

20 Claims, 6 Drawing Sheets

| IN1 | IN2 | OUTC | OUTS |
|---|---|---|---|
| 0 | 0 | 0 | 0 |
| 0 | 1 | 0 | 1 |
| 1 | 0 | 0 | 1 |
| 1 | 1 | 1 | 0 |

T2

| NSin[2] | NSin[1] | NSin[0] | NSout[2] | NSout[1] | NSin[0] |
|---|---|---|---|---|---|
| 0 | 0 | 0 | 0 | 0 | 1 |
| 0 | 0 | 1 | 0 | 1 | 0 |
| 0 | 1 | 0 | 0 | 1 | 1 |
| 0 | 1 | 1 | 1 | 0 | 0 |
| 1 | 0 | 0 | 1 | 0 | 1 |
| 1 | 0 | 1 | 1 | 1 | 0 |
| 1 | 1 | 0 | 1 | 1 | 1 |
| 1 | 1 | 1 | 0 | 0 | 0 |

FIG. 3D

MEMORY SYSTEM AND MEMORY DIE WITH CASCADED CALCULATING CIRCUITS

BACKGROUND

1. Technical Field

The disclosure generally relates to a system and a die, and more particularly, to a memory system and a memory die.

2. Description of Related Art

The three-dimensional integrated circuit (3DIC) have grown rapidly. In order to correctly access all dies stacked in the 3DIC, an identification number corresponding to a level where the die is in the stack may be programmed or set to each die through hardwires or e-fuses. However, these methodologies are required to be applied to each of the memory die they are stacked, or even during fabrication. In this way, a possibility that any of the die is misplaced to cause an error to occur in the 3DIC gets higher since each die is labeled with the identification number and must be correctly placed on a corresponding level in the stack for the 3DIC to be properly functioned.

SUMMARY

Accordingly, the present disclosure is directed to a memory system and a memory die capable of automatically and internally generating a number signal corresponding to the level where the memory die is in the 3DIC stack.

The memory system of the present disclosure includes a plurality of memory dies stacked within the memory system. Each memory die includes a numbering circuit configured to generate an output number signal according to an input number signal. The numbering circuit includes a plurality of calculating circuits coupled in series. A current stage calculating circuit is configured to receive a first output bit from a previous stage calculating circuit and a corresponding bit of the input number signal to generate the first output bit and a second output bit as a correspond bit of the output number signal.

The memory die of the present disclosure is adapted to be stacked within a memory system. The memory die includes a numbering circuit configured to generate an output number signal according to an input number signal. The numbering circuit includes a plurality of calculating circuits coupled in series. A current stage calculating circuit is configured to receive a first output bit from a previous stage calculating circuit and a corresponding bit of the input number signal to generate the first output bit and a second output bit as a correspond bit of the output number signal.

To make the aforementioned more comprehensible, several embodiments accompanied with drawings are described in detail as follows.

BRIEF DESCRIPTION OF THE DRAWINGS

FIG. 3D illustrates a truth table T2 of a numbering circuit 10*b* in FIG. 3C according to some embodiments of the present disclosure.

DESCRIPTION OF THE EMBODIMENTS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

Figure 1:
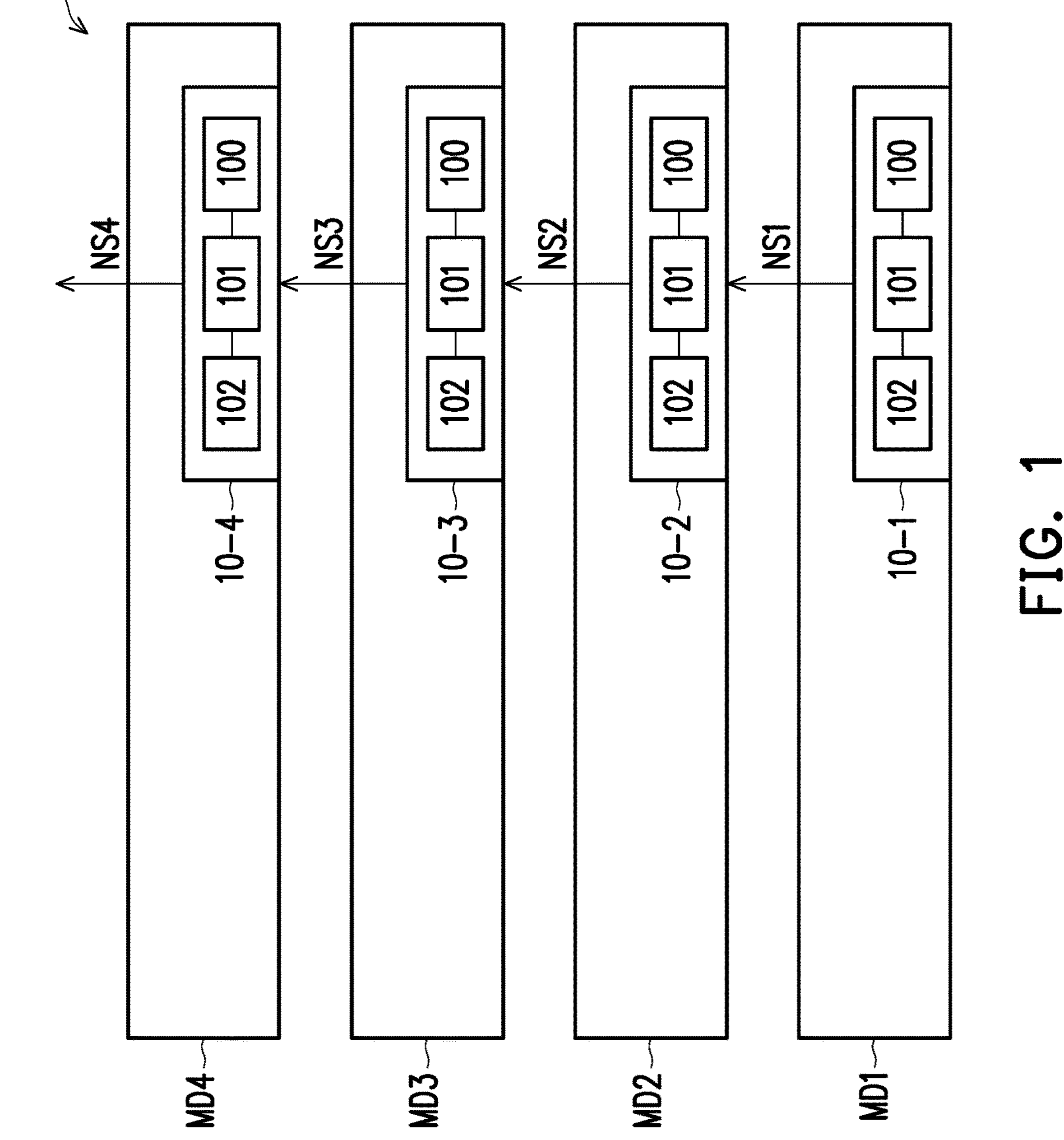
FIG. 1 illustrates a memory system 1 according to some embodiments of the present disclosure.

FIG. 1 illustrates a memory system 1 according to some embodiments of the present disclosure. The memory system 1 includes a plurality of memory dies MD1-MD4 stacking along a vertical direction within the memory system 1 serving as a three-dimensional integrated circuit (3DIC) system. Each memory die in the stack is coupled to an adjacent memory die on top or bottom level using through silicon vias (TSVs) for supports and/or data exchange. Each memory die includes a numbering circuit configured receive an input number signal from the number circuit of the adjacent memory die to generate an output number signal corresponding to a level where the memory die is in the stack, thereby automatically providing a location information for each memory die, so that the memory die may utilize the output number signal to determine whether or not to execute a received read/write signal. In some embodiments, the plurality of memory dies MD1-MD4 have the same structure, respectively utilizing the numbering circuit inside to generate the output number signal, so that a design complexity of the memory system 1 may be effectively reduced.

Specifically, the plurality of numbering circuits 10-1 to 10-4 respectively disposed in the memory dies MD1-MD4 are coupled in series. Each numbering circuit may be configured to receive the input number from the numbering circuit at a previous stage to generate the output number signal. Then, the generated output number signal may be provided to the numbering at a next stage as its input number signal. Taking the numbering circuit 10-2 in the memory die MD2 as an example, the numbering circuit 10-2 is configured to receive the input number signal NS1 from the numbering circuit 10-2 at the previous stage, and generate the output number signal NS2 accordingly. Further, each numbering circuit includes a plurality of calculating circuits coupled in series. A current stage calculating circuit is configured to receive a first output bit from a previous stage calculating circuit and a corresponding bit of the input number signal to generate the first output bit and a second output bit as a correspond bit of the output number signal. In this way, each numbering circuit may receive the input number signal from the neighboring numbering circuit at the previous stage to generate the output number signal through the serially coupled calculating circuits inside. In addition, the calculating circuits may be designed using the same circuit with a relatively simple circuit structure, thereby implementing the automatically numbering function through a simpler design, and improving a flexibility of processing the number signal of with different bit numbers.

Figure 2:
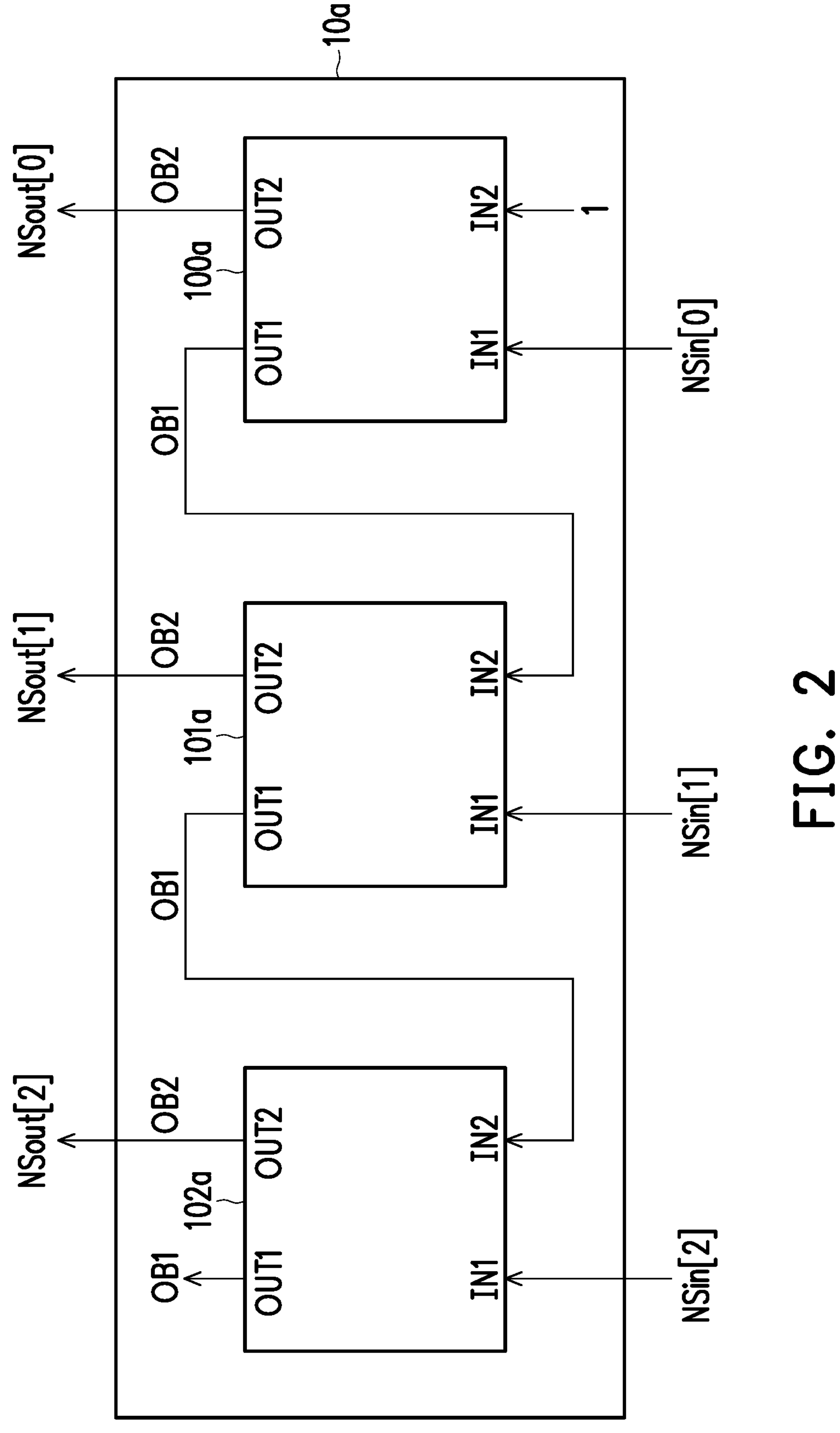
FIG. 2 illustrates a schematic diagram of a numbering circuit 10*a* according to some embodiments of the present disclosure.

FIG. 2 illustrates a schematic diagram of a numbering circuit 10*a* according to some embodiments of the present disclosure. The numbering circuit 10*a* may be applied in the memory system 1 as depicted in FIG. 1 to replace any of the numbering circuits 10-1 to 10-4. The numbering circuit 10*a* is configured to receive an input number signal NSin to generate an output number signal NSout accordingly. The numbering circuit 10*a* includes a plurality of calculating circuits 100*a*-102*a* coupled in series. The number of the calculating circuits 100*a*-102*a* may be altered based on a required bit number of the number signal or the amount of the memory dies in each stack. In the following paragraphs, descriptions will be made for explaining one of the various structures of the numbering circuit 10*a* configured for processing the three-bit number signal.

Figure 3A:
FIG. 3A illustrates a schematic diagram of a calculating circuit 100*b* according to some embodiments of the present disclosure.
Figure 3A:
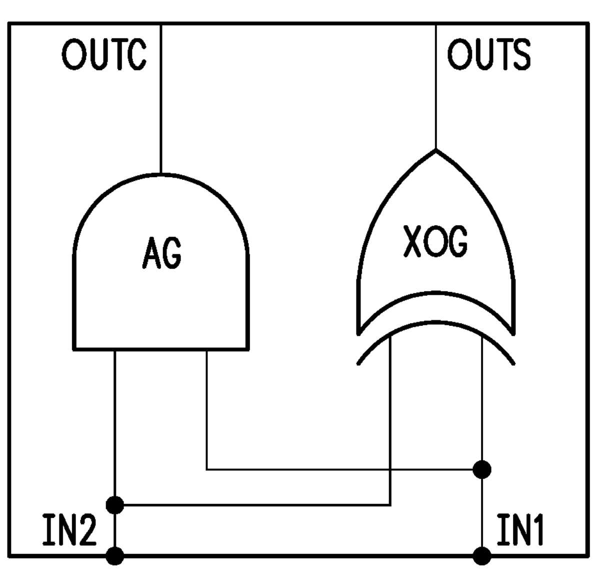

FIG. 3A illustrates a schematic diagram of a calculating circuit 100*b* according to some embodiments of the present disclosure. The calculating circuit 100*b* may be applied in the memory system 10*a* to replace any of calculating circuits 100*a*-102*a* in FIG. 2.

Specifically, the calculating circuit 100*b* includes a first input end IN1, a second input end IN2, a first output end OUTC, and a second output end OUTS. Each of the calculating circuit includes an exclusive-OR (XOR) gate XOG and an AND gate AG. Both of the XOR gate XOG and the AND gate are both coupled to the first input end and the second input end. The XOR gate XOG is configured to receive input bits from the first and second input ends IN1, IN2 to calculate a sum of the two input bits and output the sum to the second output end OUTS. Further, the AND gate AG is configured to receive the two input bits from the first and second input ends IN1, IN2 to calculate a carry of the two input bits, output the carry to the first output end OUTC.

Figure 3B:
FIG. 3B illustrates a truth table T1 of a calculating circuit 100*b* in FIG. 3A according to some embodiments of the present disclosure.

FIG. 3B illustrates a truth table T1 of a calculating circuit 100*b* in FIG. 3A according to some embodiments of the present disclosure.

In such embodiment, the calculating circuit 100*b* is functioning as a half adder. The output bits of carry and sum generated by the calculating circuit 100*b* combined correspond to a value of a summation result of the two received input bits of the calculating circuit 100*b*. Specifically, the calculating circuit 100*b* generates the output bit of 1 to the second output end OUTS when the received input bits are 01 or 10, otherwise the calculating circuit generates the output bit of 0 to the second output end OUTS when the received input bits are 00 or 11, Further, the calculating circuit 100*b* generates the output bit of 1 to the first output end OUTC when the received input bits are 11, and generates the output bit of 0 to the first output end OUTC when the received input bits are 00, 01, or 10. Therefore, a value of the output bits in combination generated by the calculating circuit 100*b* corresponds to a summation of bit values of the input bits received by the calculating circuit 100*b*.

Figure 3C:
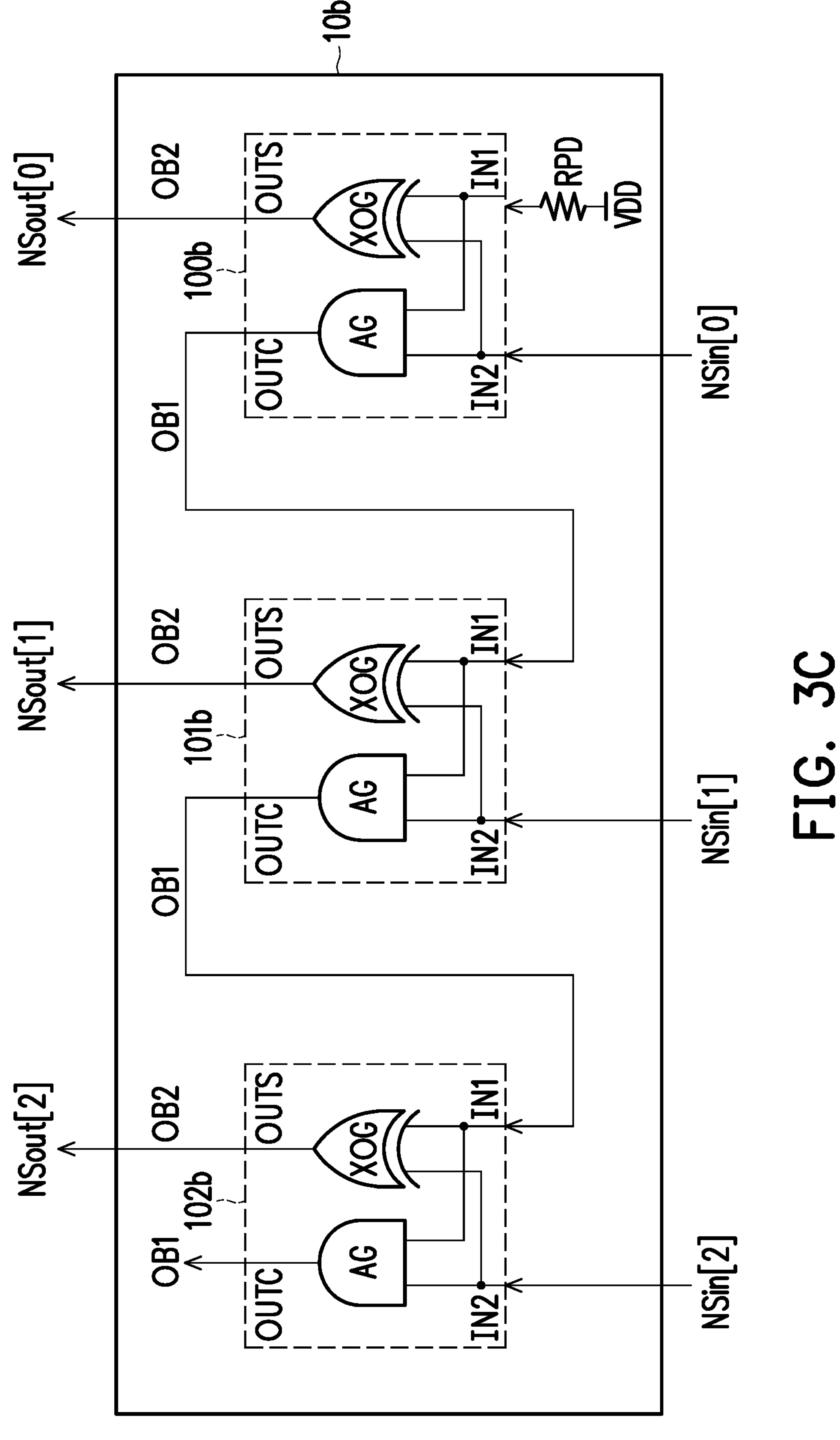
FIG. 3C illustrates a numbering circuit 10*b* according to some embodiments of the present disclosure.

FIG. 3C illustrates a numbering circuit 10*b* according to some embodiments of the present disclosure. The numbering circuit 10*b* may be applied in the memory system 1 in FIG. 1 to replace any of the numbering circuits 10-1 to 10-4. Specifically, the numbering circuit 10*b* is configured to calculate a summation of a value of the input number signal NSin with a predetermined difference to generate the output number signal NSout. For example, the predetermined difference may be set as one, and the numbering circuit 10*b* may increase the value corresponding to the input number signal by one and generate the output number signal corresponding to the location information where the memory die is in the stack. Consequently, the serially coupled numbering circuits 10*b* may generate the sequentially increased output number signals NSout.

Taking the calculating circuit 101*b* as an example, the XOR gate XOG receives input bits of the first output bit OB1 from the previous stage calculating circuit 100*b* and the corresponding bit NSin [1] of the input number signal NSin, to accordingly calculate the second output bit OB2 corresponding to the sum of the two input bits, and taken as the bit NSout [1] of the output number signal NSout. Further, the AND gate AG1 is configured to receive the input bits the first output bit OB1 from the previous stage calculating circuit 100*b* and the corresponding bit NSin [1], to accordingly calculate the first output bit OB1 corresponding to the carry of the two input bits, and the next stage calculating circuit 102*b* may take the first output bit OB1 from the current stage calculating circuit 101*b* as the input. Therefore, as the first output bit OB1 corresponding to the carry is determined by the calculating circuits 100*b*-102*b* stage by stage and to the last stage of the calculating circuit 102*b*, the calculating circuits 100*b*-102*b* may be sequentially configured to generate the corresponding bits of the output number signal NSout from the LSB to MSB.

In order for the numbering circuit 10*b* to calculate the summation of the input number signal NSin and the predetermined difference, a reference voltage VDD is provided to the first input end IN1 of at least one calculating circuit in the serially coupled calculating circuits 100*b*-102*b* through a resistor RPD. In this embodiment, the predetermined difference may be set as one, and thus the reference voltage VDD may be provided to the first stage calculating circuit 100*b* of the serially coupled calculating circuits 100*b*-102*b*. The inputted reference voltage VDD may be read as a digital value one by the calculating circuit 100*b*, thereby a summation of the input bit NSin [0] of the input numbering signal NSin and one is calculated by the calculating circuit 10*b* to generate the output bits OB2, OB1 respectively corresponding to carry and sum. The output bit OB1 generated by the calculating circuit 100*a* may be inputted to the calculating circuit 101*a* for calculating the sum and carry of the next stage. Sequentially, each stage of calculating circuit may be configured to calculate corresponding sum and carry upon receiving the carry from the previous stage calculating circuit. After the last stage calculating circuit 102 completes the calculation, the correct output number signal NSout may be generated by the numbering circuit 10*a*. However, the predetermine difference is not only limited to one. For example, by providing the reference voltage VDD (i.e., the digital value one) to the first input end IN1 of other calculating circuits, the summation of the input number signal NSin with other values of the predetermined difference may be realized, which are also within the scope of various embodiments of the numbering circuit 10*b*.

FIG. 3D illustrates a truth table T2 of a numbering circuit 10*b* in FIG. 3C according to some embodiments of the present disclosure.

In such embodiment, the predetermined difference is one, and the numbering circuit 100*b* is configured to generate the output number signal NSout by increasing the value of the received input number signal NSin by one. As can be seen in the truth table T2, the generated output number signal NSout is greater than the input number signal NSin by one. Therefore, the desired functions of the numbering circuit 10*b* is well realized by the structures of the calculating circuit 100*b*-102*b* as depicted in FIG. 3C.

Figure 4:
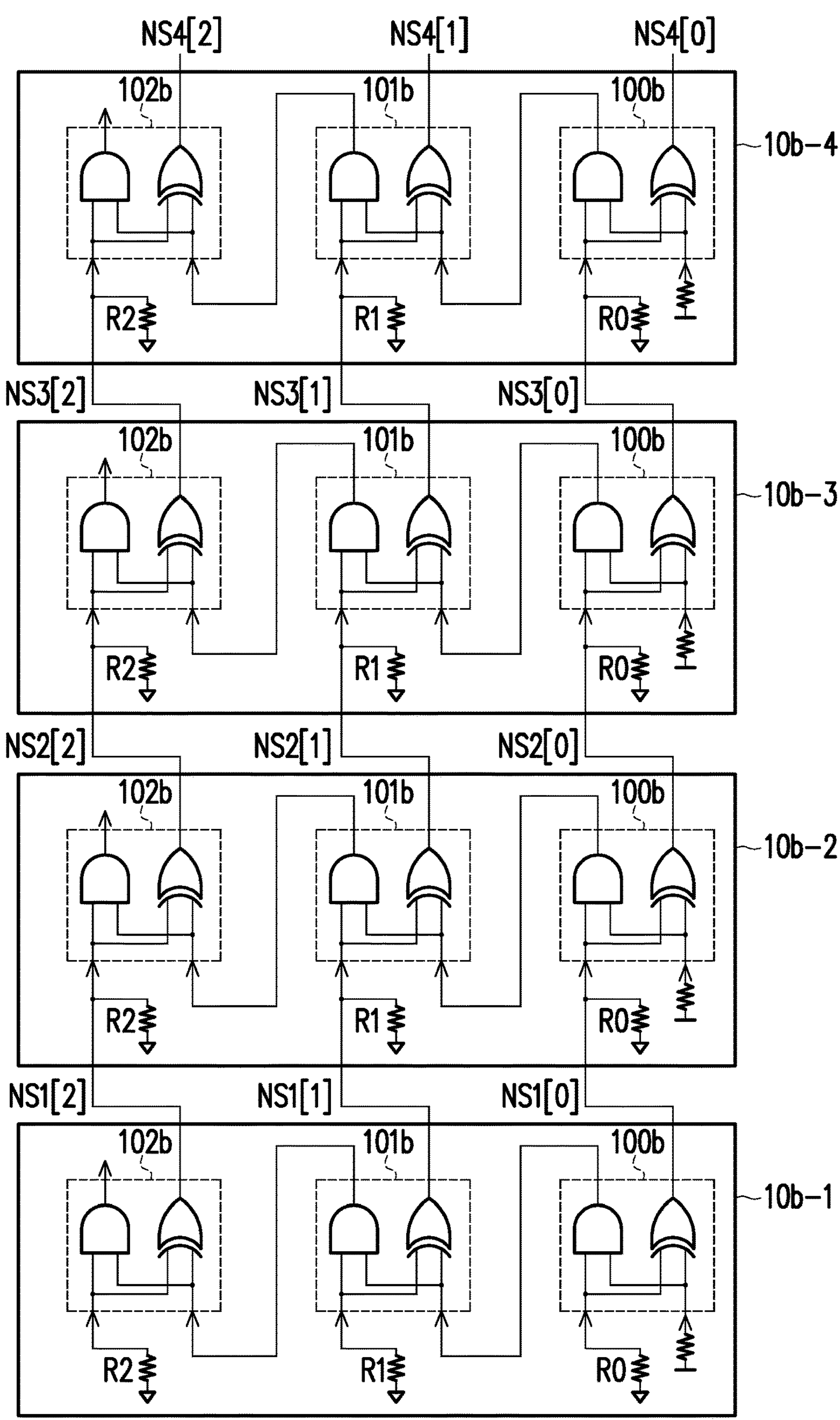
FIG. 4 illustrates a plurality of serially coupled numbering circuits 10*b*-1 to 10*b*-4 according to some embodiments of the present disclosure.

FIG. 4 illustrates a plurality of serially coupled numbering circuits 10*b*-1 to 10*b*-4 according to some embodiments of the present disclosure. Each of the numbering circuits 10*b*-1 to 10*b*-4 in FIG. 4 is similar to the numbering circuit 10*b* in FIG. 3C, and thus the symbols for the same components are omitted in FIG. 4 for clarity. The numbering circuits 10*b*-1 to 10*b*-4 in FIG. 4 may replace and represent the serially coupled numbering circuits 10-1 to 10-4 in FIG. 1.

Specifically, the numbering circuits 10*b*-1 to 10*b*-4 are coupled in series. Each numbering circuit is configured to function as a current stage numbering circuit to receive the input number signal provided from the previous stage numbering circuit and generate the output number signal to the next stage numbering circuit except the first stage numbering circuit 10*b*-1. For the first stage numbering circuit 10*b*-1 to properly start counting, a predetermined number signal is provided the first stage numbering circuit 10*b*-1, and more particularly to the second input ends of the calculating circuits 100*b*-102*b* of the first stage numbering circuit 10*b*-1. In this embodiment, a reference voltage GND is provided to the second input ends of the calculating circuits 100*b*-102*b* of the first stage numbering circuit 10*b*-1 respectively through resistors R0-R2. The reference voltage GND may be read as a digital value 0 by the calculating circuits 100*b*-102*b*, so that the first stage numbering circuit 10*b*-1 may receive the predetermined number signal of 000.

Further, since the predetermined difference is one in this embodiment, each numbering circuit may be configured to increase the value of the received input number signal by one and generate the output number signal. The bits of the number signal generated from the previous stage numbering circuit are provided to the second input ends of the calculating circuits 100*b*-102*b* of the current stage numbering circuit. However, since all numbering circuits are designed using the same circuit structure as the first stage numbering circuit, the reference voltage GND is also coupled to the second input ends of the calculating circuits 100*b*-102*b* of the current stage numbering circuit, but a driving force of the output number signal is greater than a driving force of the predetermined number signal through properly design to the resistors R0-R2 and the XOR gates XOG, so that the numbering circuit may after the first stage numbering circuit may receive the input number signal provided from the previous stage numbering circuit.

In some embodiments, the serially coupled numbering circuits may be designed to generate the number signals using different counting rules. For example, the numbering circuit may be configured to generate the current stage numbering signal in a descending or in increasing order, or the predetermined difference increased by each numbering circuit may be set to other values rather than one, or the predetermined number signal may be other values rather than zero, which are also within the scope of various embodiments.

In summary, each memory die of the memory system is capable of automatically generating a number corresponding to a level where the memory die is in the stack. The memory dies in the memory system may have the same structure with relatively simple design without additionally providing any initiating values to the first or any numbering circuits therein, Therefore, the memory system may have an easier design complexity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory system, comprising:

a plurality of memory dies stacked within the memory system, each of the memory dies comprising:

a first numbering circuit configured to generate an output number signal according to an input number signal, the first numbering circuit comprising:

a first stage calculating circuit and a previous stage calculating circuit coupled in series, wherein a first input end of the first stage calculating circuit is configured to receive a first output bit from the previous stage calculating circuit, and a second input end of the first stage calculating circuit is configured to receive a corresponding bit of a second input number signal generated by a second numbering circuit which is coupled to the second input end of the first stage calculating circuit in first numbering circuit, wherein the first stage calculating circuit is configured to generate a second output bit which serves as a correspond bit of the output number signal generated by the first numbering circuit.

2. The memory system of claim 1, wherein the first numbering circuit is configured to add a value of the input number signal with a predetermined difference to generate the output number signal.

3. The memory system of claim 2, wherein the predetermined difference is one.

4. The memory system of claim 1, wherein a plurality of bits of a predetermined number signal are provided to the second input end of the first stage calculating circuit.

5. The memory system of claim 4, wherein a first reference voltage is provided to the second input end of the first stage calculating circuit as the plurality of bits of the predetermined number signal.

6. The memory system of claim 5, wherein a resistor is coupled between the second input end of the first stage calculating circuit and the first reference voltage.

7. The memory system of claim 5, wherein a driving force of the input number signal to the second input end of the first stage calculating circuit is stronger than a driving force of the first reference voltage to the second input end of the first stage calculating circuit.

8. The memory system of claim 5, wherein a second reference voltage is provided to the first input end of a first stage calculating circuit coupled at a front most stage of a plurality of calculating circuits included in the first numbering circuit.

9. The memory system of claim 1, wherein the first stage calculating circuit is a half adder.

10. The memory system of claim 1, wherein the first stage calculating circuit comprises:

an exclusive OR (XOR) gate configured to receive the first output bit from the previous stage calculating circuit and the corresponding bit of the second input number signal to generate the second output bit as the corresponding bit of the output number signal; and an AND gate configured to receive the first output bit from the previous stage calculating circuit and the corresponding bit of the second input number signal to generate a first output bit.

11. A memory die, adapted to be stacked within a memory system, the memory die comprising:

a first numbering circuit configured to generate an output number signal according to an input number signal, the first numbering circuit comprising:

a first stage calculating circuit and a previous stage calculating circuit coupled in series, wherein a first input end of the first stage calculating circuit is configured to receive a first output bit from the previous stage calculating circuit, and a second input end of the first stage calculating circuit is configured to receive a corresponding bit of a second input number signal generated by a second numbering circuit which is coupled to the second input end of the first stage calculating circuit in first numbering circuit, wherein the first stage calculating circuit is configured to generate a second output bit which serves as a correspond bit of the output number signal generated by the first numbering circuit.

12. The memory die of claim 11, wherein the first numbering circuit is configured to add a value of the input number signal with a predetermined difference to generate the output number signal.

13. The memory die of claim 12, wherein the predetermined difference is one.

14. The memory die of claim 11, wherein a plurality of bits of a predetermined number signal are provided to the second input end of the first stage calculating circuit.

15. The memory die of claim 14, wherein a first reference voltage is provided to the second input end of the first stage calculating circuit as the plurality of bits of the predetermined number signal.

16. The memory die of claim 15, wherein a resistor is coupled between the second input end of the first stage calculating circuit and the first reference voltage.

17. The memory die of claim 15, wherein a driving force of the input number signal to the second input end of the first stage calculating circuit is stronger than a driving force of the first reference voltage to the second input end of the first stage calculating circuit.

18. The memory die of claim 15, wherein a second reference voltage is provided to the first input end of a first stage calculating circuit coupled at a front most stage of a plurality of calculating circuits included in the first numbering circuit.

19. The memory die of claim 11, wherein the first stage calculating circuit is a half adder.

20. The memory die of claim 11, wherein the first stage calculating circuit comprises:

an exclusive OR (XOR) gate configured to receive the first output bit from the previous stage calculating circuit and the corresponding bit of the second input number signal to generate the second output bit as the corresponding bit of the output number signal; and an AND gate configured to receive the first output bit from the previous stage calculating circuit and the corresponding bit of the second input number signal to generate a first output bit.

* * * * *